US005639546A

United States Patent [19]
Bilkadi

[11] Patent Number: 5,639,546
[45] Date of Patent: Jun. 17, 1997

[54] COATED ARTICLE HAVING IMPROVED ADHESION TO ORGANIC COATINGS

[75] Inventor: Zayn Bilkadi, Mahtomedi, Minn.

[73] Assignee: Minnesota Mining and Manufacturing Company, St. Paul, Minn.

[21] Appl. No.: 754,458

[22] Filed: Sep. 3, 1991

[51] Int. Cl.$^6$ ............................................. B32B 5/16
[52] U.S. Cl. ..................... 428/331; 428/343; 428/353; 428/354; 428/412; 428/422; 428/423.7; 428/424.2; 428/424.4; 428/425.5; 428/483; 428/516; 428/520; 428/694 R; 428/900; 428/932
[58] Field of Search .................................. 428/343, 353, 428/354, 694, 932, 331, 412, 421, 422, 423.7, 424.2, 424.4, 425.5, 516, 520, 694 R, 900, 483

[56] References Cited

U.S. PATENT DOCUMENTS

| | | | |
|---|---|---|---|
| 3,013,897 | 12/1961 | Cupery et al. | 428/149 |
| 4,210,712 | 7/1980 | Munger et al. | 430/275 |
| 4,249,011 | 2/1981 | Wendling | 548/312 |
| 4,262,072 | 4/1981 | Wendling et al. | 430/14 |
| 4,310,600 | 1/1982 | Cross | 428/447 |
| 4,323,591 | 4/1982 | Wendling et al. | 427/53.1 |
| 4,348,456 | 9/1982 | Imanaka et al. | 428/336 |
| 4,348,462 | 9/1982 | Chung | 428/412 |
| 4,427,823 | 1/1984 | Inagaki et al. | 524/833 |
| 4,563,388 | 1/1986 | Bonk et al. | 428/304.4 |
| 4,656,094 | 4/1987 | Kojima et al. | 428/412 |
| 4,742,111 | 5/1988 | Chi | 524/596 |
| 4,816,333 | 3/1989 | Lange et al. | 428/331 |
| 4,830,909 | 5/1989 | Cohen et al. | 428/331 |
| 4,943,479 | 7/1990 | Yamada et al. | 428/331 |

FOREIGN PATENT DOCUMENTS 0 337 695  10/1989  European Pat. Off. .......... C09D 3/80

OTHER PUBLICATIONS

*World Patents Index Latest*, Derwent Publications Ltd., London, GB; AN 89–011160 (02) & JP-A-63 286 409 (Idemitsu Petrochem KK), Abstract. (Nov. 24, 1988).
*World Patents Index Latest*, Derwent Publications Ltd., London, GB: AN 86–281363 (43), & JP-A-61 204 827 (TDK Corp.), Abstract. (Sep. 10, 1986).
*World Patents Index Latest*, Derwent Publications Ltd., London, GB; AN 88–192917 (28) & JP-A-63 128 938 (Sunstar Giken KK), Abstract. (Jun. 1, 1988).

*Primary Examiner*—D. S. Nakarani
*Attorney, Agent, or Firm*—Gary L. Griswold; Walter N. Kirn; Gregory D. Allen

[57] ABSTRACT

A coated product comprises a thermoplastic sheet support bearing on at least one surface an adhesion promoting cured layer comprising a composition of:

1) 30–80% by weight individually dispersed colloidal metal oxide particles, preferably silica, alumina and/or zirconia particles of average particle size 10–100 nanometers, 2) 20–70% by weight crosslinked polymer matrix derived from one or more polyethylenically unsaturated monomers, and 3) a photoinitiator.

Preferred embodiments of this invention include coated abrasive product in which the primed surface of the support layer is coated with a thermosetting binder containing abrasive particulates, and tape products in which the primed surface of the support layer is coated with a pressure-sensitive adhesive or magnetic media.

21 Claims, No Drawings

COATED ARTICLE HAVING IMPROVED ADHESION TO ORGANIC COATINGS

BACKGROUND OF THE INVENTION

This invention relates to articles having a primed thermoplastic support film. More particularly, the invention relates to articles prepared with this primed thermoplastic support film, and still more particularly it relates to coated abrasive products and tape products having this primed thermoplastic support film.

BACKGROUND OF THE ART

In the art pertaining to coating sheet materials there is a continuing desire to find improved methods for increasing the adhesion between the surface coating and substrate. Examples of such coated sheet materials include adhesive tapes, coated abrasives, photo-imageable sheets, and magnetic tape/disks. When thermoplastic polymers are used as substrates for these articles, the need for superior coating adhesion becomes a very important consideration. Thermoplastic substrates include polyethylene, polypropylene, polycarbonate, polyimide, and polyesters especially poly (ethyleneterephthalate) (PET). The art contains numerous descriptions of methods for treating thermoplastic surfaces to improve the adhesion of coatings thereto, such as chemical etching, electron-beam irradiation, corona treatment, plasma etching, coextrusion of adhesion promoting layers, coating substrates with adhesion promoting primer coatings and optionally crosslinking such primers prior to applying the desired surface coating. For example see: U.S. Pat. No. 3,607,354 (chemical etching), U.S. Pat. No. 4,594,262 (electron-beam irradiation), U.S. Pat. No. 4,011,358 (coextrusion of adhesion promoting layer), and U.S. Pat. Nos. 3,188,266 and 4,210,705 (UV crosslinked primer coating). The desired result of these adhesion promoting methods is to make the substrate more receptive to surface coatings and to promote strong interfacial bonds between the substrate and coating. Furthermore, when primer coatings are used to promote adhesion, they should have good thermal and chemical resistance.

Another approach to improving the adhesion to thermoplastic substrates is to raise the surface energy or hydrophilicity of the surface by application of a primer coating or through special processing like corona treatment, i.e., the exposure of the surface of the plastic to an electric discharge in air, whereby polar functionalities, such as hydroxyl or carboxyl are grafted onto the surface by oxidation reactions. While this treatment enhances the hydrophilicity or surface energy of most thermoplastics, including polyolefins like polypropylene and polyesters like PET, this increase in surface energy is not a sufficient condition for enhanced bonding or adhesion of surface coatings especially coatings having low surface energies.

Coated abrasives generally comprise a backing layer having abrasive granules supported thereon and adhered thereto. The abrasive granules may be formed of flint, garnet, aluminum oxide, alumina-zirconia, diamond, silicon carbide, etc. Binders for the purpose of adhering the abrasive granules to the backing include the traditional phenolic resins, urea-formaldehyde resins, hide glue, varnish, epoxy resins, and polyurethane resins, or more recently a class of radiation cured crosslinked acrylate binders (U.S. Pat. Nos. 4,751,138 and 4,828,583). The backing has conventionally been paper, but cotton cloth and vulcanized fiber are also used. For many specialized high performance applications, it is desirable to utilize thermoplastic film rather than paper or cloth as backing. In coated abrasives high bond strength and durability of the interface between the backing and mineral binder are of paramount importance because the interfacial shear stresses encountered under normal "cutting" conditions often reach extremely high levels. Poor adhesion of the abrasive binder results in what is called in the art "shelling", i.e., large loss of abrasive granules from the thermoplastic backing upon flexing and grinding.

In the case of adhesive tape products, a pressure sensitive adhesive composed of an acrylate rubber or other tackified rubbers is coated onto the thermoplastic sheet rather than a thermoset adhesive. Among the most commonly used thermoplastic backing for tape products are cellulose acetate, polyester, polyvinyl chloride, and especially, polyolefins. Apart from cellulose acetate, none of these films possess a surface to which a pressure sensitive adhesive naturally bonds firmly enough to provide a satisfactory tape product. This is especially true for polyolefins, namely polyethylene and biaxially oriented polypropylene, which have very low surface energies with practically no polar character. Among the recent methods for enhancing adhesion of pressure sensitive adhesives to polyolefin substrates is exposure of the substrate to an electric discharge in the presence of a chlorocarbon or fluorochlorocarbon gas as described in U.S. Pat. No. 4,844,979.

Coatings derived from mixtures of colloidal inorganic oxide particles and organic binders are known. In U.S. Pat. Nos. 4,409,285 and 4,536,420 there are described aqueous mixtures of dissolved polymers and colloidal metal oxides (silica, zirconia and alumina) which are coated onto thermoplastic films for the purpose of imparting antifogging and antireflective properties. The patent does not suggest that such films be overcoated with another polymeric layer to provide improved composite articles. Such coatings, because they contain noncross linked water soluble polymers are not suitable as primers for coated abrasives, which, as stated previously require water resistance and high temperature resistance.

European Patent Office Publication No. 301,827 describes a subbing layer for photographic emulsions comprised of a gelled network of inorganic oxide particles that imparts to a polymer surface good coatability, and enhanced adhesion promoting, antistatic, and antihalation properties. The organic component of the network is an adhesion promoting ambifunctional silane that contains no ethylenic unsaturation.

Radiation curable as well as heat curable mixtures comprising colloidal metal oxide particles, organosilicon monomers and polyethylenically unsaturated monomers have utility as abrasion resistant coatings for thermoplastics as described in U.S. Pat. Nos. 4,348,462, 4,822,828 and 4,885,332.

SUMMARY OF THE INVENTION

The invention discloses articles comprising improved thermoplastic sheet supports and processes therefore. The improved articles are obtained by depositing on the surface of thermoplastic sheets a thin film of a primer comprising a liquid mixture, hereinafter called a "Sol-Modified Monomer Mixture" (SMMM), composed of inorganic oxide sol, polyethylenically unsaturated monomers, and optional photoinitiators, and immediately exposing the above coating to ultraviolet light or electron beam radiation to effectuate crosslinking. An important feature of the invention is that the inorganic oxide particles are individually dispersed within the polyacrylate matrix, with substantially no multiparticle aggregates in the crosslinked matrix. Coating compositions of the prior art frequently contained aggregated inorganic oxide filler particles having average diameters that were from 100 to 1000 times greater than individually dispersed particles of the present invention. These particles are shown in transmission electron photomicrographs (298,000 ×) of silica particles dispersed in the composition of the invention.

It is further found, that in the case of polyester sheet substrates, namely polyethylene terephthalate and polybutylene terephthalate, it is desirable for maximum adhesion to expose the surface to a nitrogen gas corona prior to the coating step. This nitrogen gas corona treatment step is not necessary for thermoplastic substrates other than polyester. Said primers are also found to enhance adhesion of organic polymeric coatings and especially pressure-sensitive adhesives and magnetic media to virtually every substrate except PTFE. Other sheet materials with the primer layer and an adhered organic polymeric coating that can be made using this invention include: those with microstructured surfaces such as fresnel lenses; those comprised of photoimageable layers such as silver halide, dry silver, diazotype, etc.; toner receptor layers; and dielectric media containing photoconductive layers.

An especially preferred embodiment of the invention comprises coated abrasive sheets that exhibit excellent adhesion of mineral binder to the support film and improved "Cutting", i.e., abrading performance. Accordingly, coated abrasive products utilizing a polyester support film can be obtained by a three-step process including:

1) exposing the polyester film to an electric discharge in nitrogen gas, a so-called nitrogen gas corona, 2) depositing on the surface of the support film a thin coating of the sol-modified monomer mixture comprising:

a) 30–80% by weight colloidal metal oxide particles, dispersed in b) 20–70% by weight of one or more polyethylenically unsaturated monomers, and c) an initiator, preferably a photoinitiator, 3) crosslinking the liquid mixture as by exposing the above coating to ultraviolet radiation or electron beam radiation.

In the case of thermoplastic substrates other than polyester the same priming process applies, with the exception that step 1 is optional.

The resulting surface modified thermoplastic film exhibits superior bonding to a wide variety of adhesives, most notably the abrasive binders normally used in the coated abrasives industry, namely phenolic resins, epoxy resins, urea-formaldehyde resins, and even non-thermosetting resins such as urethane and acrylate rubbers used in pressure-sensitive adhesive tapes and as binders for magnetic media.

DETAILED DESCRIPTION OF THE INVENTION

An improved priming layer for organic polymeric substrates and organic polymeric overcoat layers is the cured product of a composition comprising:

a) at least 5% by weight of a polyfunctional acryloyl monomer, and b) 5–80% by weight of non-agglomerated colloidal silica, The composition comprising at least 15% by total weight of polymerizable acryloyl materials, inclusive of component a). In order to provide the desired priming function, it is necessary that silicone materials (such as polymers oligomers, and lower molecular weight material) which tend to provide release properties, be used in low amounts (e.g., no more than 10%, preferably 5% or less) or more preferably, not be present at all in the composition.

Preferred polyethylenically unsaturated monomers useful in this invention are the polyfunctional acrylate monomers of the general formula:

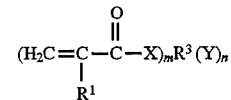

wherein:

$R^1$ is hydrogen, a lower alkyl group of 1 to 4 carbon atoms, or halogen. Preferably $R^1$ is hydrogen or methyl;

X is —O— or —NHR$^2$ in which $R^2$ is hydrogen or a lower alky group having one to four carbon atoms;

$R^3$ is a polyvalent group, cyclic or linear, aliphatic, aromatic or heterocyclic, having carbon, hydrogen, and oxygen and optionally nitrogen and halogen atoms. Oxygen and nitrogen atoms are generally present in ether, ester, urethane, amide, and urea groups. $R^3$ has a molecular weight of 14 to 1000 and a valence of m+n;

m is an integer designating the number of acrylic or methacrylic groups in the ester or amide having a value 1 to 9, preferably m has a value of 2 to 5 or where a mixture of acrylic or methacrylic compounds are used, m has an average value of 1.05 to 5;

n is an integer having a value of 1 to 5; and

Y is hydrogen or lower alkyl or a protic functional group preferably selected from —OH, —COOH, —CONHR$^2$, —COONH$_4$, —SH, —NHR$^2$, —NHCOOR$^2$, —SO$_3$H—, —SO$_4$NH$_4$, —PO(OH)$_2$, —PO(ONH$_4$), and oxazolidone in which $R^2$ is hydrogen or a lower alkyl group having 1 to 3 carbon atoms.

Examples of the preferred polyethylenically-unsaturated monomers of use in the composition of the invention are the polyacrylic acid or polymethacrylic acid esters of polyhydric alcohols including, for example, the diacrylic acid and dimethacrylic acid esters of aliphatic diols such as ethyleneglycol, triethyleneglycol, 2,2-dimethyl-1,3-propanediol, 1,3-cyclopentanediol, 1-ethoxy-2-3-propanediol, 2-methyl-2,4 pentanediol, 1,4-cyclohexanediol, 1,6-hexamethylenediol, 1,2-cyclohexanediol, 1,6-cyclohexanedimethanol; the triacrylic acid and trimethacrylic acid esters of aliphatic triols such as glycerin, 1, 2, 3-propanetrimethanol, 1,2,4-butanetriol, 1,2, 5- pentanetriol, 1,3,6-hexanetriol, and 1,5,10-decanetriol; the tetraacrylic and tetramethacrylic acid esters of aliphatic triols such as 1,2,3,4-butanetetrol, 1,1,2,2,-tetramethylolethane, 1,1,3,3,-tetramethylolpropane, and pentaerythritol tetraacrylate; the pentacrylic acid and pentamethacrylic acid esters of aliphatic pentols such as adonitol; the hexacrylic acid and hexamethacrylic acid esters of hexanols such as sorbitol and dipentaerythritol; the diacrylic acid and dimethacrylic acid esters of aromatic diols such as resorcinol, pyrocatechol, bisphenol A, and bis(2-hydroxyethyl) phthalate; and the trimethacrylic acid ester of aromatic triols such as pyrogallol, phloroglucinol, and 2-phenyl-2,2-methylolethanol; and mixtures thereof. Other polyethylenically-unsaturated monomers that can be used in the composition of the invention are diallyl phthalate, divinyl ether, 1,2-divinyloxyethane 1,4-(dicrotonyloxy)butane and the like.

Examples of polyethylenically unsaturated monomers containing heterocyclic groups are the multi-functional acrylate or methacrylate monomers derived from the coupling of the cyclic isocyanurates (structure I) with a variety of monofunctional or multifunctional hydroxyacrylate or methacrylate monomers, such as 2-hydroxy ethyl acrylate or pentaerythritol triacrylate. For example, a multi-functional acrylate monomer is obtained when 3 molar equivalents of pentaerythritol triacrylate are reacted with one mole of isocyanurate.

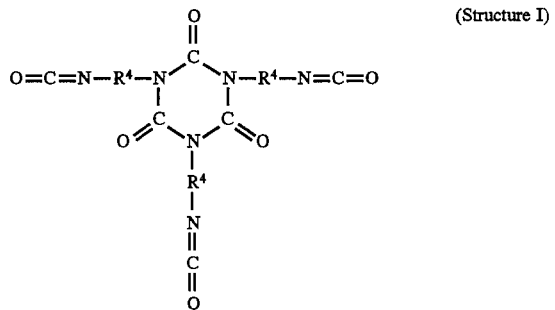
(Structure I)

wherein:

$R^4$ is a divalent alkyl radical containing from 1 to 10 carbon atoms preferably about 6 available from Mobay Chemical Co. Inc., Pittsburgh, Pa.

Examples of polyethylenically unsaturated monomers of (structure II) where Y is a protic group include the acrylic acid and methacrylic acid esters of aliphatic, aromatic or heterocyclic polyhydric alcohols of the general formula:

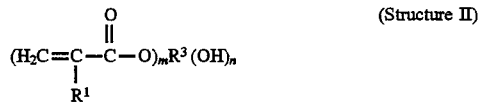
(Structure II)

wherein $R^1$, $R^3$, m, and n are defined above. Examples of such ester include 2-hydroxyethyl acrylate and methacrylate, 3-hydroxypropyl acrylate and methacrylate, caprolactone monoacrylate monomer, TONE™ M-100 (Union Carbide), 1-acryloyloxymethyl-2-hydroxymethyl propane, 2-meth-acryol-oxy-ethyl-2-hydroxymethylpropane, penta-erythritol, mono-, bis-, and tri- acrylate and methacrylate, dipentaerythritol di-, tri-, tetra-, and penta- acrylate and methacrylate, sorbitol triacrylate, sorbitol hexacrylate, hydantoin tri-, penta-, and hexaacrylate, and the like.

It is preferable that the photocurable compositions contain appropriate energy activated initiators of polymerization to effect crosslinking either in air or in inert atmosphere, such as nitrogen.

Polymerization initiators suitable for use in the crosslinkable compositions of the invention are those compounds which liberate or generate a free-radical on addition of energy. Such catalysts include peroxy, azo, and redox systems all of which are well known and are described frequently in polymerization art. Included among free-radical catalysts are the conventional heat-activated catalysts such as organic peroxides and organic hydroperoxides, e.g., benzoyl peroxide, tetrabutyl perbenzoate, cumen hydroperoxide, azobis(isobutyronitrile) and the like. The preferred catalysts are photopolymerization initiators which facilitate polymerization when the composition is irradiated. Included among such initiators are acyloin and derivatives thereof, such as benzoin, benzoin methyl ether, benzoin ethyl ether, benzoin isopropyl ether, benzoin isobutyl ethers and methylbenzoin, diketones such as benzil and diacetyl etc.: phenones such as acetophenone, 2,2,2-tribromo-1-phenylethanone, 2,2-diethoxyacetophenone, 2,2-dimethoxy-2-phenylacetophenone, 2,2,2-tribromo-1-(2-nitrophenyl)ethanone, benzophenone, and 4,4-bis (dimethylamino)benzophenone. Normally the initiator is used in amounts ranging from 0.1 to 10%, preferably 2 to 4%, by weight. Other preferred photoinitiators include diaryliodonium photoinitiators such as diphenyl iodonium hexafluoroantimonate.

The composition of the invention can be diluted with up to 6 parts, preferably 1 to 2 parts, by weight per part of polyethylenically-unsaturated monomer of any monoethylenically- unsaturated monomer copolymerizable with the polyethylenically unsaturated monomer. Generic classes of useful comonomers include acrylic acid and methacrylic acids, esters and anhydrides; ethylenically unsaturated anhydrides, olefins, acrylamides; ethylenically unsaturated ureas and urethanes; vinyl esters, vinyl ethers, vinyl halides, vinyl epoxy resins, vinyl heterocycles, and prepolymers and polymers of these materials. Particularly suitable monoethylenically- unsaturated monomers include methyl methacrylate, ethyl acrylate, styrene, butadiene, 2-chlorostyrene, 2,4-dichlorostyrene, acrylic acid, acrylamide, acrylonitrile, t-butyl acrylate, methyl acrylate, butyl acrylate, N-vinyl pyrrolidone, 2-(N-butylcarbamyl) ethyl acrylate/methacrylate, 2-(N-ethylcarbamyl)ethyl acrylate/methacrylate, and 1,3,5-tri(2-methacryloxyethyl)-s-triazine.

The inorganic oxide sols used to prepare the inventive composition have an average particle size in the range 1 to 100 nanometers, preferably in the range 5 to 50 nanometers, and most preferably in the range of 10–20 nanometers. Colloidal silicas are especially preferred and can be prepared by methods well known in the art. Colloidal silicas in water or water-alcohol solutions are available commercially under such trade names as Ludox™ (manufactured by E. I. dupont de Nemours and Co., Inc., Wilmington, Del., USA) or Nalco™ (manufactured by Nalco Chemical Co., Oak Brook, Ill., USA). Although both alkaline and acidic forms of silica hydrosols are available commercially, colloidal dispersions having a pH lower than 7 and preferably lower than 4 should be used, otherwise rapid flocculation would ensure. One excellent starting material is Nalco™ 1129 which is provided as colloidal silica dispersion in 60%/40% by weight isopropanol/water solution wherein the mean particle size is 20 nanometers, the pH is 3.5 and the solid content is 30% by weight. Another excellent commercial starting material is Nalco 1034A available as a silica hydrosol with mean particle size of 20 nanometers, pH 3.2, and solid content of 34% by weight. It should be obvious to those skilled in the art, however, that any collodial silica hydrosol, including alkaline silica hydrosols, may be used as sources of silica particles for the embodiment of this invention as long as their pH is reduced to the 2.5–7.0 range.

The separation of the aqueous colloidal silica from the water and its transfer to a volatile non-aqueous solvent that is compatible with the class of polyacrylates described above may be effected by first adding a water-miscible organic solvent A and removing the water. If the water miscible solvent A has a boiling point lower than that of water, the water can be removed by azeotropic distillation. It is preferable that the water be removed as rapidly as possible and at as low a temperature as possible. Consequently, it is preferable to conduct the distillation under vacuum. This procedure is also disclosed in U.S. Pat. No. 4,499,217.

Preferably the water-miscible solvents of use in the dehydration of the colloidal silica are protic group containing solvents such as the lower alcohols having 1 to 4 carbon atoms, lower glycols having 2 to 6 carbon atoms and ether oxygen, and most preferably lower glycol ethers having 3 to 6 atoms and 1 to 2 ether linkages. Specific examples are methanol, ethanol, 2-propanol, n-butanol, t-butyl alcohol, ethylene glycol, methoxyethanol, ethoxyethanol, and propoxyethanol, butoxyethanol, methyl "Carbitol", and ethyl "Carbitol" and mixtures of any combination thereof. The use of these protic solvents allow the dehydradation to be carried out to the point where water is substantially all removed. For example use of propoxy ethanol in the vacuum distillation of water from acidic colloidal silica allows the dehydradation to proceed to less than 1% residual water in the remaining alcoholic dispersion. In this manner up to 65% by weight colloidal silica dispersion in propoxyethyl alcohol may be easily prepared.

Non-protic water-miscible solvents that can also be used in the dehydration of colloidal silica are aliphatic esters and ketones such as ethyl acetate, propyl acetate, butyl acetate, methoxyethyl acetate, ethoxyethyl acetate, propoxyethyl acetate, butoxyethyl acetate, triethyl phosphate, methyl ethyl ketone and methyl propyl ketone. However, in the majority of cases where a water-miscible ester or ketone has to be used, it is preferred to have an alcohol present even as a minor component during the dehydration step. Thus 90/10 mixtures of alcohol in the acetates or ketones mentioned above is often suitable. The photocurable compositions also contain appropriate photosensitizers specially formulated to effect crosslinking either in air or in inert atmosphere, such as nitrogen. In general the amount of photosensitizers may vary from about 0.01 to 10% by weight of the total polymerization composition. When the quantity is less than 0.01% by weight, the polymerization rate becomes extremely low. If the initiator is used in excess of 5% by weight, no correspondingly improved effect can be expected. Thus addition of such greater quantity is economically unjustified. Preferably, about 0.25 to 4.0% of initiator is used in the polymerizable composition.

The compositions of the present invention may generally be described as containing:

(a) 5–80% by weight of colloidal silica (the liquid phase having less than 3% by weight water present, this being the definition of "water-free"), (b) at least 5% by weight of a polymerizable polyacrylate, (c) at least 15% by weight of polymerizable acryloyl (including the polyacrylate), (d) 0.1 to 10% by weight of a free radical initiator (including both thermal and photo initiated systems), and (e) 0.1 to 25% by weight of a polymerizable diluent or binder resin soluble in the solution of the polyethylenically unsaturated monomers.

Preferably the composition comprises 10–70% water-free silica sol, most preferably 30–70% water-free silica sol; 5–90% polyacryloyl compound, most preferably 30 to 70% polyacryloyl compound; 5–90% acryloyl monomer (including mono- and polyacryloyl), 0–20% compatible filler resin, and 0.5 to 7.0% photoinitiator system in a preferably non-aqueous solvent carrying medium. The viscosity and percent solids of the composition may be adjusted by addition of one or more of the aforementioned volatile, nonaqueous protic or non-protic solvents.

These compositions are particularly useful when applied to substrates that would show adverse effects if subjected to 100° C. for more than 15 minutes, and preferred for substrates that would show adverse effects when exposed to 80° C. for 15 minutes. Such adverse effects would include discoloration, shrinkage, warping, imaging, or permanent change in physical or chemical properties.

For photocuring thin film coatings of said compositions in air, preferable photosensitizers consisting of mixtures of ketone type and hindered amine type compounds are used. Among the preferred ketones are benzophenone, acetophenone, benzil, benzaldehyde and o-chlorobenzaldehyde, xanthane, thioxanthone, 9,10-anthraquinone, and many aromatic ketones. Among the preferred hindered amines are methyldiethanolamine, ethyldiethanolamine, dimethylethanolamine, diethylenethanolamine, triethanolamine, phenylmethylethanolamine, dimethylaminioethyl benzoate, and others. Preferred ratios by weight of ketone to amine are between 80/20 and 20/80, but in general ratios of 50/50 to 60/40 are satisfactory.

For effecting photocure in an inert environment, such as nitrogen or argon, many commercially available photosensitizer compounds are known, among which those known under the trade name Irgacure™ (available from Ciba-Geigy Co.), for example Irgacure™ 184 (2-hydroxy-2-cyclohexyl-1-phenyl-1-ethanone).

For effecting the cure with particle radiation, e.g., gamma rays, X-rays, alpha and beta particles from radioisotopes, electron beams and the like, no additional source of free radicals for initiating polymerization and crosslinking is required.

In the practice of the present invention, the curable coating compositions are compounded by adding together the silica organosol, preferably being 30–40% by weight silica in an organic solvent, the polyfunctional acrylate monomer or mixture thereof, preferably being 20–30% by weight solution in suitable organic solvent, the optional monofunctional or polymeric diluents, an initiator in the proportion of about 2–4% by weight of polymerizable monomers, and any other optional additives such as flexibilizers, thickeners, stabilizer, inhibitors, lubricants and dyes. Where curing is to be brought about by ultraviolet irradiation it is preferable that these addenda be transparent to the radiation used in curing. After thorough mixing of the components, a generally homogeneous coating composition is obtained which may be applied to substrates in any number of ways: by dipping, spraying, spincoating, rollcoating, knifecoating, electrospraying, and the like. Afterwards the solvent, if any, is allowed to evaporate and the coating cured in air by UV irradiation at dosages of from 1 megarad to 100 megarad or more. The UV radiation used may have a wavelength ranging from 18.5 to 400 nm. Suitable sources of radiation include mercury, xenon, carbon arc and tungsten filament lamps, sunlight, etc.

Pressure-sensitive adhesives are art recognized as a standard class of materials. These are adhesives which in dry (substantially solvent free except for residual solvent) form are aggressively and permanently tacky at room temperature (e.g., 15° to 25° C.) and firmly adhere to a variety of dissimilar surfaces upon mere contact without the need for more than manual pressure. They require no activation by water, solvent or heat in order to exert a strong adhesive holding force towards such materials as paper, cellophane, glass, wood and metals. They have a sufficiently cohesive holding and elastic nature that, despite their aggressive tackiness, they can be handled with the fingers and removed from smooth surfaces without leaving a substantial residue (cf. Test Methods for Pressure-Sensitive Tapes, 6th Ed., Pressure Sensitive Tape Council, 1953). Pressure-sensitive adhesives and tapes are well known, and the wide range and balance of properties desired in such adhesives has been well analyzed (cf. U.S. Pat. No. 4,374,883; and "Pressure-Sensitive Adhesives" in *Treatise on Adhesion and Adhesives* Vol. 2, "Materials", R. I. Patrick, Ed., Marcel Dekker, Inc., N.Y., 1969). The various materials and compositions useful as pressure-sensitive adhesives are available commercially and are thoroughly discussed in the literature (e.g., Houwink and Salomon, *Adhesion and Adhesives*, Elsevier Publ. Co., Amsterdam, Netherlands, 1967; Handbook of Pressure-Sensitive Adhesive Technology, Donates Satas, Ed., Van-Nostrand Reinhold Co., N.Y. 1982).

Pressure-sensitive adhesives are generally chemically composed of rubber-resin materials, acrylic resins, polyurethane resins, silicone resins, and the like. Among the various patent references describing compositions and improvements in pressure-sensitive adhesives formulations are Reissue U.S. Pat. No. 24,906; U.S. Pat. No. 2,652,351; U.S. Pat. No. 3,740,366; U.S. Pat. No. 3,299,010; U.S. Pat. No. 3,770,708; U.S. Pat. No. 3,701,758; U.S. Pat. No. 3,922,464; U.S. Pat. No. 3,931,087; U.S. Pat. No. 4,012,560; U.S. Pat. No. 4,077,926; U.S. Pat. No. 4,387,172; U.S. Pat. No. 4,418,120; U.S. Pat. No. 4,629,663; and the like. These classes of rubber resin, acrylic, silicone, and polyurethane pressure-sensitive adhesives as well as any other pressure-sensitive, thermally-activatable, solvent-activatable, or water-activatable adhesives are generally useful in the present invention.

TEST METHODS

Modified Crosshatch Adhesion Test (ASTM D3359-83)

This test requires scribing the coated specimens to form a grid of twenty 5 mm×5 mm squares. Clear cellophane tape is applied to the surface, pressed down and stripped sharply away at an angle of 90° to the surface. The test is repeated three times, using fresh tape each time. Removal of any square of coating is considered an adhesion failure, and 100% adhesion indicates no removal of coating from any square. The 3M #610 cellophane tape having a crude rubber pressure-sensitive adhesive and 3M Scotch Brand Filament tape having an acrylic pressure-sensitive adhesive were used in the following tests. The crosshatch adhesion tests were conducted at ambient conditions (about 20° C./50% relative humidity) and after aging for 100 hours at 35° C./95% relative humidity.

180° Peel Adhesion Test (ASTM D3330-78; PSTC - 1 (11/75))

The peel adhesion is the force required to remove a pressure-sensitive adhesive coated test specimen from a test panel measured at a specific angle and rate of removal. In the examples, this force is expressed in Newton per decimeter (N/dm) width of coated sheet. The procedure followed was:

1) A test specimen 12.7 mm wide is applied to horizontally positioned clean glass test plate. A 2.2 kg rubber roller is used to press a 12.7 cm length of specimen into firm contact with the glass surface.

2) The free end of the specimen is doubled back nearly touching itself so the angel of removal is 180°. The free end is attached to adhesion testing apparatus Model SP-102B-3M90 available from Instrumentors Inc.

3) The peel rate is specified in the examples.

EXAMPLE 1

Sol-modified monomer mixture A was prepared as follows: One part of a 30% by weight solution of pentaerythritol triacrylate (SR 440 monomer, available from Sartomer Corp.) in isopropanol was mixed with two parts Nalco 84SS-258 (an anhydrous silica sol comprised of 30% by weight colloidal silica particles dispersed in 2-propoxyethanol, having an average particle size of 15 nm [Available from Nalco Co. Inc.]) and 0.04 part by weight Irgacure® 184 (Ciba-Geigy Co. Inc.).

Sol modified coating mixtures B and C were similarly prepared by adding one part of 30% SR440 solution isopropanol to 1 and 0.5 parts by weight Nalco 84SS-258 silica sol respectively followed by the addition of 0.012 part Irgacure® 184 photoinitiator.

A control solution D consisted of 30% SR440 solution in isopropanol with 1.2% Irgacure® 184 photoinitiator.

Each of the mixtures A, B, C, and D was coated using a number 9 RDS Laboratory Coating Rod (R.D. Specialties, Webster, N.Y.) onto 8 cm×12 cm sheets of the following substrates:

Substrate 1: A 100 micron thick, unprimed, slip-agent free biaxially-oriented polyethylene terephthalate film (PET) from 3M Company.

Substrate 2: Was the same as substrate 1 with the exception that it was exposed to a corona discharge in nitrogen gas under the following conditions: web speed 30 m/min, oxygen concentration less than 20 ppm, electrode gap 1.9 mm, and energy density 0.5 J/cm$^2$.

EXAMPLE 2

Each of the coating mixtures A, B, C, and D of Example 1 was applied to the following substrates using the procedure described in Example 1:

Substrate 3—Nitrogen corona treated 100 micron thick Mylar™ polyester film

Substrate 4—Nitrogen corona treated 100 micron thick Melinex™ polyester film

Substrate 5—Unprimed 175 micron thick Lexan™ polycarbonate film

Substrate 6—Unprimed 100 micron thick Kapton™ polyimide

Substrate 7—Unprimed, additive free, 100 micron thick biaxially oriented polypropylene film (Manufactured by 3M)

Substrate 8—Unprimed, additive free, 100 micron thick biaxially oriented polypropylene film (Manufactured by Teijin)

Substrate 9—Substrate 6 which has been passed through a nitrogen plasma

Substrate 10—Substrate 6 which has been passed through a corona in air

Substrate 11—Unprimed 175 micron thick Dowlex™ 2032 polyethylene

Substrate 12—Unprimed 175 micron thick Nylon™ 66

Substrate 13—Na/NH3 etched, 175 micron calendered polytetrafluoro-ethylene

Substrate 14—Unprimed 6 mm thick Lucite™ polymethylmethacrylate sheet

Substrate 15—Unprimed 175 micron thick Lucite™ polymethylmethacryl-ate film.

where the coating, drying, and curing conditions were identical to those of Example 1. The crosshatch adhesion test (described above) revealed 100% adhesion both before and after aging for substrates 3–15 when the coating mixtures were A, B, or C. However, the UV cured film delaminated easily from each substrate when coating mixture D was used.

EXAMPLE 3

This example illustrates coated abrasive constructions with superior adhesion of thermosetting resin "make" coat to primed polyester film backings.

Polyester backings 2, 2A, 2B, and 2C were prepared as in Example 1 and then knife-coated with a conventional phenol-formaldehyde resole resin "make" coat solution (75% phenol-formaldehyde in aqueous solution, pH 4.2) at a wet coating thickness of 25 microns. The phenolic "make" coat was then drop coated with 132.0 g/m² of 80 grade Al₂O₃ mineral. The coated constructions were then placed in an oven at 110° C. for 3 hours to effect cure of the phenol-formaldehyde binder. In the case of substrates 2A, 2B, and 2C, the cured "make" coat exhibited excellent adhesion to the backing, it resisted 180° bending with adhesion failure and could not be stripped from the polyester backing by scraping with a sharp edged tool. On the other hand, when the coated abrasive belts were constructed using substrate 2, the cured "make" coat did not adhere to the backing and delaminated easily from the polyester backing upon bending the construction through 180°.

EXAMPLE 4

A 10.5 cm wide coated abrasive belt with excellent abrasive action was constructed as follows: 3 meter long sheets of substrates 2 and 2B of Example 1 were knife-coated with a conventional phenol-formaldehyde resole resin "make" coat (75% by weight acidic phenol-formaldehyde resin in water, made by 3M) at a coating weight of 60.5 g/m². The phenolic "make" coat was then drop coated with 172.8 g/m² of 80 grade Al₂O₃ mineral. The "make" coat was then partially cured by heating in an oven at 93° C. for 75 minutes. A second layer, known in the art as the "size" coat, was brush coated on top of the mineral and partially cured "make" coat. The "size" coat was comprised of the same phenol-formaldehyde resin used in the "make" coat. The coating weight of the "size" coat was 132.8 g/m². The coated abrasive constructions were then thermally cured by heating in an oven for 30 minutes at 88° C., followed by 30 minutes at 102° C., followed by 2.5 hours at 110° C. The resulting sheets were cut into 5 cm wide abrasive belts. The belts were mounted on a slide action testing machine having a particle board work piece measuring 27.5 cm×75 cm×1.6 cm. The loading pressure, at the grinding interface, was 0.7 kg/cm². A total of six particle boards were ground for 300 seconds each using a new belt for each test. The average weight of particle board cut after 30 minutes of grinding was 3048.55+155.92 grams for the abrasive belt constructed from substrate 2B. In the case of abrasive belts constructed from substrate 2 of Example 1 the cured "make" coat did not adhere to the substrate and disintegrated into loose flakes upon slight bending of the belt.

EXAMPLE 5

This example illustrates a pressure-sensitive adhesive (PSA) tape or sheet construction with superior adhesion of the PSA to the synthetic resin film backing.

Five micron thick strips of an acrylic pressure sensitive adhesive composed of nine parts iso-octylacrylate copolymerized with one part acrylic acid was laminated under 34.5K Pascal pressure to a degreased aluminum plate (1 mm thick) which had been previously roughened with steel wool and Scotch Brite™ pads under a detergent solution. After removing the protective liner from the adhesive layer, a strip of unprimed Lexan™ (Substrate 7), 175 micrometer (7 mil) in thickness, was applied to the adhesive layer under 34.5K Pascal pressure. One end of the Lexan™ strip was then attached to a peel tester (Instrumentors Inc., Peel Tester Model SP-102B-3M90) and the average peel force measured in triplicate runs. The peel force is the force required to detach the Lexan™ strip from the adhesive layer at an angle of 180° and at peel rate of 30 cm/min. This test was repeated in exactly the same manner using a Lexan™ film which had been coated with a 5 micrometer thick layer of primer compound prepared as in Example 1. It was found that in the case of unprimed Lexan™ the adhesive layer remained anchored to the aluminum plate as the Lexan™ strip was peeled off at an average force of 22.2 N/dm. In the case of the Lexan™ strip coated with the primer compound in Example 1, the adhesive layer transferred to the primed Lexan™ upon peel at an average peel force of 102 N/m. The adhesion of the iso-octylacrylate-acrylic acid pressure sensitive adhesive to the Lexan™ film was therefore enhanced more than fourfold by the crosslinked primer (obtained by curing sol modified monomer mixture A) composed of 66.7% by weight colloidal silica and 33.3% by weight pentaerythritol triacrylate.

EXAMPLE 6

Samples of the polyolefinic substrates 9, 10, 11, and 12 of Example 2 were coated with the sol-modified monomer mixture A of Example 1 and subjected to exactly the same curing procedure described therein. After the curing step, each polyolefinic substrate was subjected to the peel test procedure of Example 5 to ascertain the effect of the primer derived from mixture A on the adhesion of the pressure-sensitive adhesive. Comparison with the observed peel forces for each substrate with and without primer revealed, as is shown in Table II, that the bond strength between the PSA and polyolefin is enhanced by more than ninefold times by the UV cured primer in the case of biaxially-oriented polypropylene and by more than sixfold times in the case of extruded polyethylene film.

TABLE II

| | PEEL FORCE | | |
|---|---|---|---|
| Substrate | Primer | (N/dm) | Failure |
| 7 | None | 22.2 | Substrate-adhesive |
| 7 | Example 1 | 102 | Aluminum-adhesive |
| 9 | None | 7.0 | Substrate-adhesive |
| 9 | Example 1 | 63.4 | Within adhesive |
| 10 | None | 4.9 | Substrate-adhesive |
| 10 | Example 1 | 65.0 | Within adhesive |
| 11 | None | 11.0 | Substrate-adhesive |
| 11 | Example 1 | 64.2 | Within adhesive |
| 12 | None | 5.0 | Substrate-adhesive |
| 12 | Example 1 | 32.1 | Substrate-adhesive |

EXAMPLE 7

The peel test procedure in Example 2 was repeated on Lexan™ strips which have been primed with a composition prepared as follows:

In a 500 cc round bottom flask was dissolved 50 g of 1-vinyl-2-pyrrolidone monomer (99%, Aldrich Chemicals) in 1000 g of ethanol. To this solution was added with agitation 100 g of colloidal Zirconia (Nyacol Corp., composed of 19.4% solids, with average particle size in the 5–10 nanometer range) and the water-alcohol in the dispersion removed at 55° C. in a roto evaporator. To the residual thick syrup were added 20 g of trimethylolpropane tetracrylate (SR351, Sartomer Corp.), and 2.7 g of Irgacure® 184 photoinitiator.

One part of the above zirconia dispersion was diluted with two parts ethanol and coated and cured on four 15 cm×25 cm sheets of Lexan™ using exactly the same procedure as in Example 1. The cured coatings exhibited 100% crosshatch adhesion as in Example 1 and resisted scratching by #0000 steel wool. The primed Lexan™ strips were coated with the iso-octylacrylate/-acrylic acid PSA of Example 5 and subjected to the peel test procedure of Example 5. The average peel force over triplicate runs required to detach the primed Lexan™ strips from the pressure sensitive adhesive was 129 N/dm compared to 22.2 N/dm when the Lexan™ substrate was not primed.

EXAMPLE 8

A priming suspension was prepared as follows: to 100 parts by weight Nalco 1034A silica sol (34% solids, pH 3.2, average particle size 20 nm) was added 34 parts N-vinyl-2-pyrrolidone, and 34 parts pentaerythritol acrylate. The mixture was dehydrated on a roto evaporator at 60° C. To the resulting dehydrated silica sol (less than 0.5% water as determine by Karl Fisher titration) was added 6.7 parts by weight Iragacure® 184 photoinitiator to give mixture E. Mixture E was knife coated on substrate 2 of Example 1 to a thickness of 2.5 microns and exposed to a UV light source as in Example 1 to effect cure. Onto this primed PET film a 10 micron thick magnetic dispersion was coated. The magnetic dispersion had the following composition: 100 parts by weight acicular, cobalt doped gamma $Fe_2O_3$ (surface area of 42 m2/g BET, Hc of 780 Oe, particle size 500 nm×50 nm); 10 parts polyurethane resin (Estane™ 5703, available from B.F. Goodrich); 10 parts nitrocellulose available from Hercules Inc. Wilmington, Del.); 4 parts carbon black; 1 part butyl stearate, 100 parts methyl ethyl ketone, 100 parts toluene, 50 parts cyclohexanone; and 4 parts polyisocyanate (Desmondure™ 3300 available from Mobay Chemical Co., Inc, Pittsburgh, Pa.). After drying, the resulting magnetic tape was calendered between two steel rolls under 50 pounds per lineal inch pressure. Adhesion of the magnetic coating to the primed PET film was excellent according to the 100% crosshatch adhesion test of Example 1. The magnetic coating did not adhere to unprimed biaxially oriented PET substrates 1 or 2 when these control coatings were subjected to the crosshatch adhesion test.

What is claimed is:

1. A multilayered article comprising a flexible polymeric substrate having on at least one surface thereof a primer layer and over that primer layer an organic polymeric coating, said primer layer comprising the cured product of a composition comprising
   a) at least 5% by weight of a polyfunctional acryloyl monomer, and said composition containing less than 10% by weight of any silicone materials, and
   b) 5–80% by weight of colloidal silica particles, said silica particles being individually dispersed in said composition,
said composition comprising at least 15% by weight of materials that are polymerizable acryloyl materials, inclusive of component a).

2. The article of claim 1 wherein said colloidal silica is provided in a liquid phase having less than 3% by weight of said phase as water.

3. The article of claim 2 wherein 0.1 to 25% by weight of said composition comprises a diluent selected from the group consisting of a polymerizable diluent or a binder resin soluble in said polymerizable acryloyl monomers.

4. The article of claim 3 wherein said primer layer contains the residue of a free radical photoinitiator.

5. The article of claim 4 where said coating over said primer layer is selected from the group consisting of an abrasive particle containing layer, a photosensitive imageable layer, a pressure-sensitive adhesive layer, and a magnetic recording media layer.

6. The article of claim 2 wherein said primer layer contains the residue of a free radical photoinitiator.

7. The article of claim 2 where said coating over said primer layer is selected from the group consisting of an abrasive particle containing layer, a photosensitive imageable layer, a pressure-sensitive adhesive layer, and a magnetic recording media layer.

8. The article of claim 1 wherein 0.1 to 25% by weight of said composition comprises a diluent selected from the group consisting of a polymerizable diluent or a binder resin soluble in said polymerizable acryloyl monomers.

9. The article of claim 8 wherein said primer layer contains the residue of a free radical photoinitiator.

10. The article of claim 8 where said coating over said primer layer is selected from the group consisting of an abrasive particle containing layer, a photosensitive imageable layer, a pressure-sensitive adhesive layer, and a magnetic recording media layer.

11. The article of claim 1 wherein said primer layer contains the residue of a free radical photoinitiator.

12. The article of claim 11 where said coating over said primer layer is selected from the group consisting of an abrasive particle containing layer, a photosensitive imageable layer, a pressure-sensitive adhesive layer, and a magnetic recording media layer.

13. The article of claim 1 where said coating over said primer layer is selected from the group consisting of an abrasive particle containing layer, a photosensitive imageable layer, a pressure-sensitive adhesive layer, and a magnetic recording media layer.

14. The article of claim 1 wherein said polyfunctional acryloyl monomer has the general formula

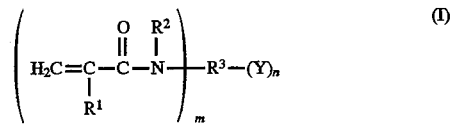

wherein:

$R^1$ is hydrogen, a lower alkyl group of 1 to 4 carbon atoms, or halogen, $R^2$ is hydrogen or a lower alkyl group having 1 to 4 carbon atoms, $R^3$ is a polyvalent aliphatic, aromatic or heterocyclic group, having a molecular weight of 14 to 1000 and a valence of m+n, m is an integer having a value of 2 to 5;

n is an integer having a value of 1 to 5, and

Y is hydrogen, lower alkyl group, or a protic functional group.

15. The article of claim 14 wherein said polyfunctional acryloyl monomer is derived from the reaction of the heterocyclic structure

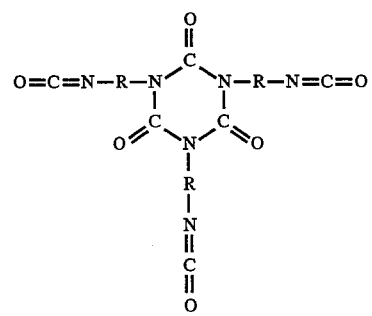

with hydroxyacrylate or hydroxymethacrylate monomers, wherein:

R is a divalent alkyl group containing from 1 to 10 carbon atoms.

16. The article of claim 15 wherein the substituent Y is a protic substituent selected from COOH, CONHR, COONH$_4$, SH, NHR, NHCOOR, SO$_3$H, SO$_4$NH$_4$, PO(OH)$_2$ or PO(ONH$_4$) wherein R is hydrogen or a lower alkyl group having 1 to 3 carbon atoms.

17. The article of claim 1 wherein said polymerizable materials comprise 1 to 2 parts by weight N,N-dimethylacrylamide per part polyfunctional acryloyl monomer.

18. A multilayered article comprising a polymeric substrate having on at least one surface thereof a primer layer and over that primer layer an organic polymeric coating, said primer layer comprising the cured product of a composition comprising a) at least 5% by weight of a polyfunctional acryloyl monomer, and said composition containing less than 10% by weight of any silicone materials, and b) 5–80% by weight of colloidal silica particles, said silica particles being individually dispersed in said composition, said composition comprising at least 15% by weight of materials that are polymerizable acryloyl materials, inclusive of component a).

19. The article of claim 18 wherein said colloidal silica is provided in a liquid phase having less than 3% by weight of said phase as water.

20. The article of claim 18 wherein said substrate comprises a polymeric film selected the group consisting of polyethylene, polypropylene, polyester, polycarbonate, polytetrafluoroethylene, and polymethylmethacrylate film.

21. The article of claim 18 wherein said polyfunctional acryloyl monomer has the general formula

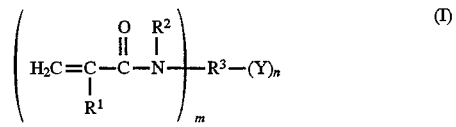

wherein:

R$^1$ is hydrogen, a lower alkyl group of 1 to 4 carbon atoms, or halogen,

R$^2$ is hydrogen or a lower alkyl group having 1 to 4 carbon atoms,

R$^3$ is a polyvalent aliphatic, aromatic or heterocyclic group, having a molecular weight of 14 to 1000 and a valence of m+n, m is an integer having a value of 2 to 5;

n is an integer having a value of 1 to 5, and

Y is hydrogen, lower alkyl group, or a protic functional group.

* * * * *